United States Patent [19]
Kelton et al.

[11] Patent Number: 5,790,604
[45] Date of Patent: Aug. 4, 1998

[54] METHOD AND APPARATUS FOR AUTOMATIC FREQUENCY CORRECTION ACQUISITION

[75] Inventors: James Robert Kelton, Oak Park; David Paul Gurney, Algonquin; Michael Russel Mannette, Bloomingdale, all of Ill.

[73] Assignee: Motorola, Inc., Schaumburg, Ill.

[21] Appl. No.: 909,972

[22] Filed: Aug. 12, 1997

Related U.S. Application Data

[63] Continuation of Ser. No. 574,538, Dec. 19, 1995, abandoned.

[51] Int. Cl.[6] .................... H04L 27/06; H04L 27/22
[52] U.S. Cl. .................. 375/344; 375/326; 455/192.2; 455/182.2
[58] Field of Search ................... 375/344, 326, 375/329, 376, 327; 329/304; 348/536, 735; 331/1 A; 455/136, 182.2, 192.2, 192.1, 164.2, 164.1

[56] References Cited

U.S. PATENT DOCUMENTS 4,941,155  7/1990  Chuang et al. ................ 375/344
5,471,508 11/1995  Koslov .......................... 375/344
5,579,338 11/1996  Kojima .......................... 375/344

*Primary Examiner*—Stephen Chin
*Assistant Examiner*—Betsy L. Deppe
*Attorney, Agent, or Firm*—Charles D. Gavrilovich

[57] ABSTRACT

An improved automatic frequency correction acquisition system utilizes an automatic frequency correction (AFC) loop (22) having an acquisition mode in which an estimate of the frequency offset of a received carrier signal is rapidly acquired and a tracking mode in which the automatic frequency correction loop more accurately follows changes of the frequency offset. The AFC is switchable in response to predetermined control signals between the acquisition mode and the tracking mode. A carrier to impairment ratio estimator (36) is coupled with the automatic frequency correction loop (22) for estimating the carrier to impairment ratio of the incoming carrier signal. An automatic frequency correction controller (30) is coupled with the automatic frequency correction loop (22) and with the carrier to impairment ratio estimator (30) and is responsive to the carrier to impairment ratio estimate being at or above a preselected threshold value for producing a tracking control signal (24) comprising one of the predetermined control signals. The automatic frequency correction loop (22) is responsive to the tracking control signal (24) for switching from the acquisition mode to the tracking mode.

9 Claims, 2 Drawing Sheets

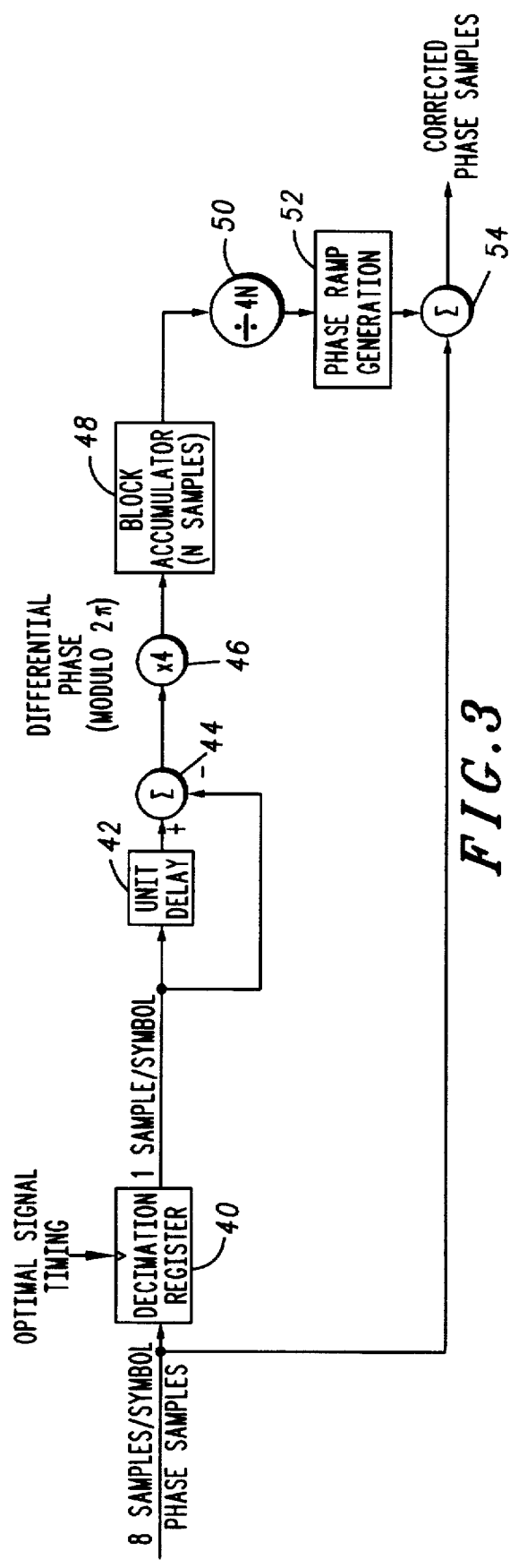
FIG.3
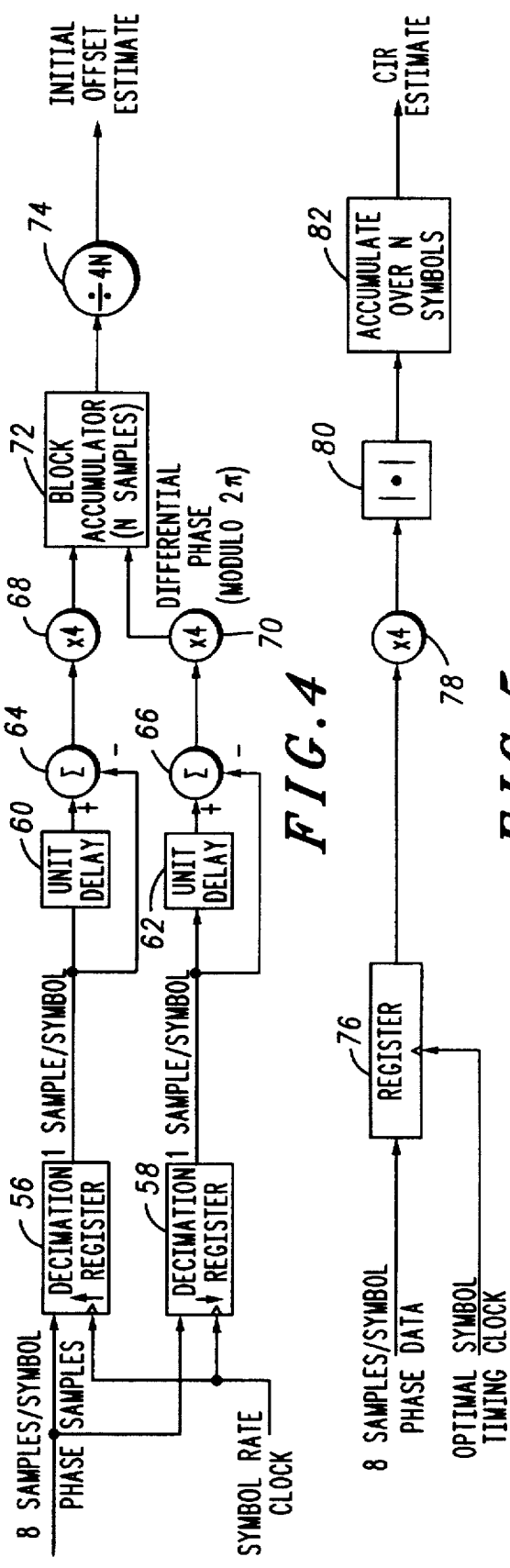
FIG.4
FIG.5

METHOD AND APPARATUS FOR AUTOMATIC FREQUENCY CORRECTION ACQUISITION

This is a continuation of application Ser. No. 08/574,538, filed Dec. 19, 1995 and now abandoned.

BACKGROUND

The present invention relates generally to the use of automatic frequency correction (AFC) in the field of digital communications, and more particularly to the use of AFC in a communications system wherein digital information is modulated onto a high frequency carrier in the form of phase variations in the carrier. One such form of modulation is known as quadrature phase-shift keying (QPSK), also referred to as quaternary PSK and quadriphase keying.

This modulated carrier is generally transmitted by a transmitter at one location and received by a receiver at another location. While various forms of communications systems may utilize the present invention, the ensuing discussion will be facilitated by particular reference to a cable communications system in which telephony is to be implemented over an existing cable TV transmission and reception system.

In such a system, and indeed in any system in which transmitter and receiver are at separate locations, the reference oscillators at the transmitter and receiver will not initially be locked to one another. Therefore, the receiver will perceive a frequency offset in the carrier of the received signal, that is, its center frequency will appear offset somewhat from its actual center frequency. In systems where phase modulation is being utilized, errors will occur when attempting to extract the phase modulation from the received signal, since this frequency offset will appear as a phase ramp in the received signal. One method and apparatus for removing this frequency offset is automatic frequency correction (AFC). Basically, an AFC loop will estimate the frequency offset and remove it from the received signal.

In most high performance AFC loops, the loop is switched between two modes of operation. In the first mode, called acquisition mode, the AFC loop quickly acquires a crude estimate of the frequency offset of the incoming signal. This mode allows the loop to quickly converge on an estimate, but produces somewhat rough or noisy estimates. In the second mode, referred to as the tracking mode, the AFC loop achieves a highly accurate estimate of the carrier offset, but requires a somewhat longer time to converge to a final estimate. Accordingly, it is typical to initially place an AFC loop into an acquisition mode to acquire the frequency offset of a new or unknown carrier frequency quickly and then switch to a tracking mode to allow the AFC loop to accurately track the frequency offset once the initial estimate is achieved.

A significant problem in using this method is to determine when to switch modes. That is, enough time must be allowed for the AFC loop in the acquisition mode to acquire the initial frequency offset estimate. However, the transmitted data cannot be reliably decoded and received until this estimate is known to be accurate (i.e., implying operation in the tracking mode), and therefore it is also desirable to minimize the time the AFC loop is in the acquisition mode. Thus, these two considerations compete In some systems, a fixed time interval is provided for the acquisition mode, and at the expiration of this time the AFC loop is switched to the tracking mode. However, when utilizing a fixed time switching procedure such as this, a relatively long time must be permitted in the acquisition mode to account for the worst case or maximum anticipated time to acquire a reasonable initial estimate of the frequency offset. If this time is excessive, data will be lost while the AFC loop remains in the acquisition mode, and the receiver is unable to accurately receive data.

Consequently, a novel and improved method of automatic frequency correction (AFC) acquisition, and a system for carrying out AFC acquisition in accordance with this method, is desirable.

BRIEF DESCRIPTION OF THE DRAWINGS

The features of the present invention which are believed to be novel are set forth with particularity in the appended claims. The organization and manner of operation of the invention, together with further objects and advantages thereof may best be understood by reference to the following description, taken in connection with the accompanying drawings in which like reference numerals identify like elements, and in which:

FIG. 3 illustrates further details of one embodiment of the AFC loop of FIG. 2 operating in a tracking mode;

FIG. 4 shows further details of one embodiment of the AFC loop of FIG. 2 operating in an acquisition mode; and FIG. 5 illustrates further details of one embodiment of the CIR estimating circuit of FIG. 2.

DETAILED DESCRIPTION OF THE DRAWINGS

Figure 1:
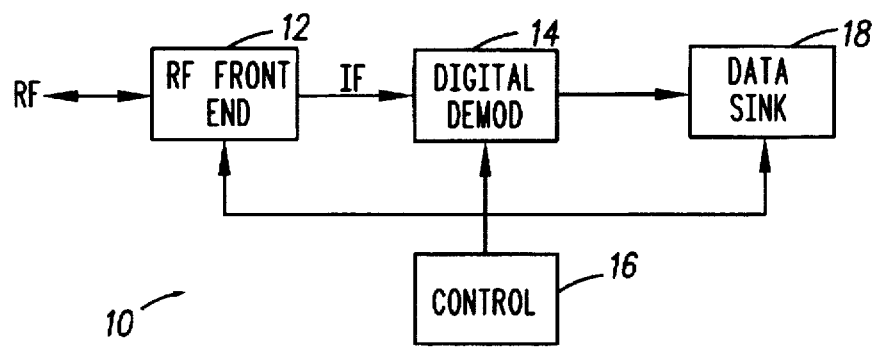
FIG. 1 is a block diagram of a receiver.

Referring now to the drawings and initially to FIG. 1, there is shown a receiver 10, which in accordance with the preferred embodiment of the invention is located at the subscriber end of a cable TV network to provide connection mode services (e.g. telephony) over the cable TV network. Accordingly, the receiver 10 of FIG. 1 has a radio frequency (RF) front end 12 which receives an incoming radio frequency signal, typically over a coaxial cable. This RF front end 12 amplifies this incoming signal, converts the carrier frequency to a lower value or intermediate frequency (IF) signal more suitable for processing, and hard limits this lower frequency modulated carrier.

A digital demodulator 14 receives the IF signal from the RF front end 12 and recovers the digital data which was used to modulate the received carrier and in which the transmitted information resides. A control circuit or controller 16 provides control of the entire receiver 10 and, among many other tasks, is charged with initiating the acquisition mode of an automatic frequency correction (AFC) loop which resides within the digital demodulator 14. In digital receivers, this controller 16 will frequently comprise some type of a microcontroller. A data sink 18 represents the ultimate destination in the receiver of the demodulated data and could comprise a number of devices including an audio codec, a computer network, or other subscriber equipment, including conventional telephone equipment.

Figure 2:
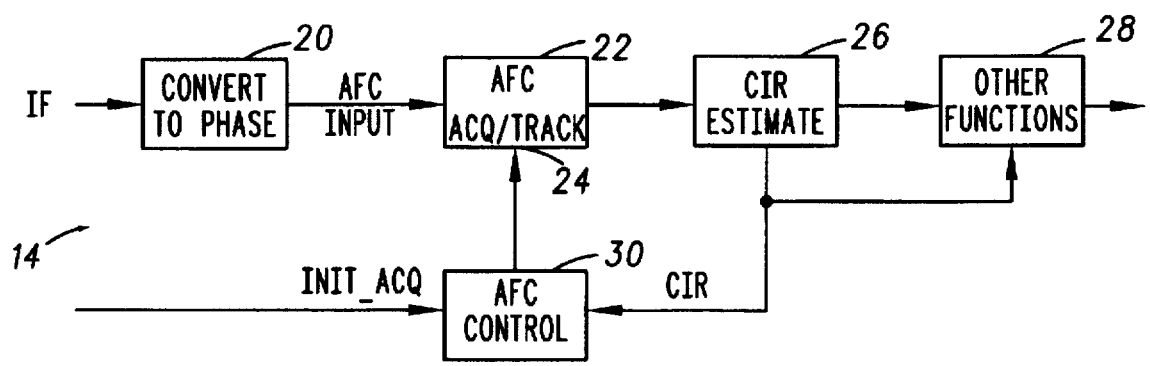
FIG. 2 is a block diagram of a demodulator portion of the receiver of FIG. 1.

Referring now to FIG. 2, elements of the digital demodulator 14 are illustrated in some further detail. The particular demodulator illustrated is intended for use with phase modulation, and preferably with quadriphase modulation such as quadrature phase-shift keying. However, other forms of modulation might be utilized without departing from the invention.

A phase converter block 20 of the demodulator 14 in FIG. 2 converts the incoming hard limited IF signal to phase samples so as to produce an automatic frequency correction input signal with phase modulation and delivers this automatic frequency correction input signal to the automatic frequency correction (AFC) loop 22. As previously mentioned, the preferred form of the invention utilizes QPSK modulation in which there are four phase states or positions in the time or frequency domains within a single period. In this form of modulation, a symbol time may represent up to two bits at a time from the data stream which maps to one of the four points in the QPSK modulation. Thus, one symbol time is essentially the time required to transmit two bits of information. Preferably, the phase converter 20 converts the IF signal to phase at a conversion rate of eight samples per symbol and subtracts a phase ramp from these phase samples to effectively remove the $\pi/4$ shift, resulting in a signal with QPSK modulation. This phase sequence is fed into the AFC loop 22.

It will be noted that in the phase domain, a frequency offset will result in a phase ramp being added to the desired signal. This frequency offset can be effectively removed from the incoming phase sequence by subtracting a constant phase ramp with the slope determined from the frequency offset estimate made from the phase sequence. This can be seen by examining the equation of a phase modulated signal imposed on a carrier frequency of $\omega c$ radians/second with a frequency offset of $\omega \text{off}$ radians/second. The received signal R will be given by:

$$R = Re[(I-jQ)e^{j(\omega c + \omega \text{off})t}]$$

where I and Q are known as the in-phase and quadrature components of the modulation. After performing a complex mixing of the signal R to remove the carrier at $\omega c$, the resulting signal is given by:

$$R' = (I-jQ)e^{j\omega \text{off} t}$$

Note that the phase is altered by the complex exponential resulting in a constant ramp of slope $\omega \text{off}$ radians/second.

The AFC loop 22 estimates the frequency offset of this phase sequence using one of two methods, depending on whether the AFC loop is in an acquisition mode or a tracking mode. Generally speaking, when the AFC loop is in an acquisition mode, an estimate of the frequency offset of a received carrier signal at its input is relatively rapidly acquired. In a second or tracking mode, the AFC loop more accurately follows changes in the frequency offset or, stated another way, converges upon a more accurate final estimate of the carrier offset. This latter or tracking mode procedure is generally slower and more time consuming than the relatively rapid acquisition mode operation. The AFC loop 22 is switchable in response to predetermined control signals at a control input 24 thereof between the acquisition mode and the tracking mode.

Many forms of AFC loop may be utilized within the scope of the invention, the invention requiring only that the AFC loop have an acquisition mode and a tracking mode and be responsive to control signals for switching between these two modes. For purposes of illustrating a preferred form of AFC loop, reference is invited to FIGS. 3 and 4 which respectively illustrate the tracking mode and the acquisition mode of a preferred embodiment of an AFC loop. First, a general discussion of the tracking and acquisition modes is offered. Then, a more specific description of the block functional diagrams illustrated in the figures is given.

Generally, in the tracking mode, and referring to FIG. 3, the frequency offset is estimated using the knowledge that at the optimal sampling instant, the change in phase from one symbol to the next with QPSK modulation must be either zero, $\pi/2$, $\pi$ or $3\pi/2$ radians. Multiplying this phase difference by four will yield zero, $2\pi$, $4\pi$ or $6\pi$ radians, which are all equivalent to zero because angular measurements are made modulo $2\pi$. After multiplying by four, this difference will result in a mean offset which is proportional to the frequency offset. Averaging over several symbols can therefore give a very accurate estimate of the frequency offset of the incoming signal. However, this method requires that the system know the ideal sampling instant of the received signal, which in turn implies that the frequency offset of the incoming signal is known. Therefore, this method cannot be used to acquire a carrier with an unknown frequency offset.

To avoid this problem, the AFC loop 22 uses a method called T/2 spaced estimation in the acquisition mode (see FIG. 4). This method continuously determines the difference between the present phase sample and the sample spaced one symbol time prior to the present sample. This difference is computed for every fourth phase sample and then multiplied by four. On average, this process will result in a process with a mean determined by the frequency offset, and the mean can be estimated by summing this difference over several symbols. This process will produce a sequence with a higher variance than in the tracking mode process because the samples are taken without knowledge of the optimum sampling time. However, because this process does not require knowledge of the optimum sampling instant; it can be carried out without knowledge of signal timing and therefore can be used prior to removal of the frequency offset. The duration of the averaging process in the tracking mode will be set much longer, and the optimum sampling time is known. This allows better estimates of the frequency offset, but results in the much slower response time in the tracking mode, as noted above.

More specifically, and referring to the block diagram of FIG. 3, in the tracking mode, the AFC circuit takes phase samples at the optimal signal timing at a rate of eight samples per symbol in the embodiment, at a decimation register 40. Because the optimal signal timing is known in the tracking mode, four times the change in phase from one signal to the next will be zero, as mentioned above, with any frequency offset giving a non-zero phase change. Accordingly, the samples are delayed at a unit delay 42 and then summed at a summing junction 44, which will give the phase change from one sample to the next. This phase difference is multiplied by four, as indicated at reference numeral 46. A block accumulator 48 accumulates a plurality (N) of samples from the multiplication at 46. The samples are then divided by an integral multiple of four, as indicated at reference numeral 50, to accomplish the above-mentioned averaging over several samples. This signal is then utilized to generate a phase ramp at a phase ramp generator 52 so that this phase ramp may be subtracted from the phase samples at a summer 54 to arrive at corrected phase samples, as was described hereinabove with reference to the foregoing equations illustrating how a frequency offset results in a phase ramp being added to the desired signal.

Referring to the block diagram of FIG. 4, the T/2 spaced estimation in the acquisition mode is illustrated. Here, the phase samples are entered into a pair of decimation registers 56, 58, which are clocked by a symbol rate clock. The samples from the decimation registers 56 and 58 are delayed at unit delays 60, 62 and the change in phase is then determined by summing the delayed samples with the original samples at respective summing junctions 64, 66. These differences are multiplied by four at multipliers 68, 70 and a plurality of samples are accumulated at a block accumulator 72 and thereafter divided by an integral of four, as indicated at reference numeral 74, to give an initial offset estimate.

Following processing by the AFC loop 22, a carrier to impairment ratio (CIR) estimate circuit 26 performs an estimate of the CIR of the incoming signal. While different CIR circuits might be utilized without departing from the invention, the operation of a preferred form of CIR circuit is illustrated in FIG. 5.

This CIR estimation uses the mean absolute error of the differential phase signal. This method relies on the observation that at the optimal sampling instant, four times the phase difference between two consecutive samples should be zero. However, due to noise, interference and frequency offset, the actual value will be non-zero. By summing the absolute value of this difference over several symbols, an estimate of CIR can be obtained. We have found that from 32 to 64 symbol estimates are sufficient for this purpose.

However, because the estimate is performed before optimal symbol timing has been determined, we also prefer to take a plurality of such summations per symbol, and preferably eight such summations. Thus, the first summation will be done on sample zero, eight, sixteen, etc., the second summation will be done on samples one, nine, seventeen, etc. and the final estimation will be done on samples seven, fifteen, twenty-three, etc. for a phase sequence with eight phase samples per symbol time. Of these eight summations, the one with the lowest value will most probably correspond to the one closest to the optimal sampling instant (in a statistical sense) and is therefore the one used as an estimate of CIR. Thus, the accumulator block in FIG. 5 will both perform the necessary summations and act as a comparator to compare the summation to select the one with the lowest value. In this manner, a good estimate of CIR can be obtained without prior knowledge of the optimal sampling time.

More specifically, referring to the block diagram of FIG. 5, the CIR estimation as described above may be carried out by feeding the phase data into a register 76, which is clocked at the optimal signal timing by an optimal symbol timing clock. The samples from the register 76 are multiplied by four, as indicated at reference numeral 78. The absolute value is then taken at block 80 and accumulated or summed over a plurality of symbols, as indicated at block 82, to obtain a CIR estimate, as described above.

The CIR estimate may be utilized in a plurality of other functions of the receiver 10, as indicated diagrammatically in FIG. 2 at functional block 28.

In accordance with the invention, we have recognized that because a frequency offset in the signal produced by the AFC loop 22 will produce a non-zero offset in the estimate of CIR, this estimate can be used to detect frequency offsets. Thus, the decision of when to switch the AFC loop 22 from the acquisition mode to the tracking mode may be based upon the CIR estimate.

In operation, when the receiver first attempts to acquire a new modulated carrier, either upon power up or upon a change of carriers at the transmitter, suitable external control circuitry (not shown) will produce and initiate acquisition (INIT-ACQ). For example, many transmitters change carrier frequency upon detecting an unacceptable signal quality at the carrier currently in use. Thus, the invention advantageously speeds and facilitates the process of reacquiring a new carrier frequency at the receiver 10. An AFC control circuit 30 responds to this initiate acquisition control signal by producing a suitable acquisition control signal at the control input 24 of the AFC loop 22 for causing the AFC loop 22 to switch to the acquisition mode.

Figure 6:
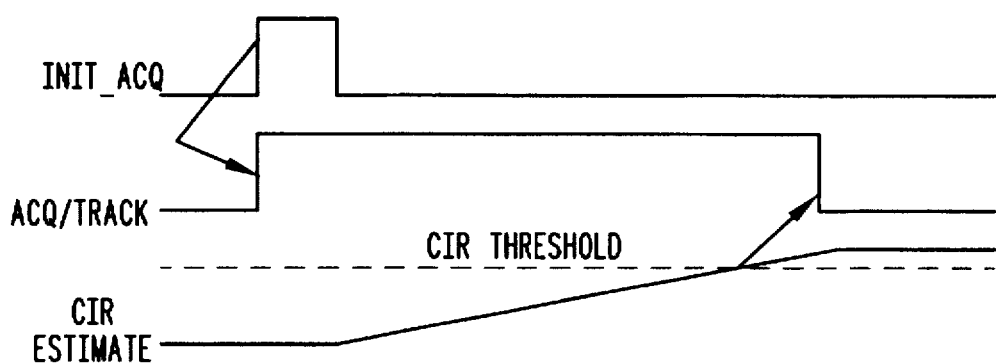
FIG. 6 is a diagram illustrating switching of an AFC loop between an acquisition mode and a tracking mode in response to a carrier to impairment ratio (CIR) estimate.

With the AFC loop 22 in the acquisition mode, and as its frequency offset estimate becomes more accurate, the estimate will result in a higher carrier to impairment ratio (CIR). Thus, in accordance with the invention, when the CIR reaches a predetermined threshold, as illustrated in FIG. 6, a suitable CIR threshold signal will be fed to the AFC control circuit 30. The AFC control circuit responds to the CIR estimate reaching this predetermined threshold by producing a suitable tracking control signal at the control input 24 of the AFC loop 22. The AFC loop 22 responds to this tracking control signal by switching from the acquisition mode to the tracking mode.

The CIR threshold need not be a fixed value, but may be varied, based upon measured channel conditions. Thus, the threshold may be decreased for a poorer channel and increased for a better channel, based for example on the estimated CIR obtained in the foregoing process. Also, this threshold may be a programmable function.

Thus, the AFC control circuit 30 is utilized to switch the AFC loop 22 to acquisition mode when requested by the external source, that is, the initiate acquisition signal. On the other hand, the AFC control circuit monitors the CIR estimate and switches to the tracking mode when the CIR estimate exceeds a given threshold value, whereupon the AFC control circuit 30 functions to hold the AFC loop 22 in the tracking mode unless and until a further initiate acquisition signal is received.

The above-described operations for carrying out the invention might also be implemented in software without departing from the invention.

What has been illustrated and described herein is a novel method and system for improved AFC acquisition, in which the CIR estimate of the incoming signal is utilized to determine when to switch an AFC loop from its acquisition mode to its tracking mode.

While particular embodiments of the invention have been shown and described in detail, it will be obvious to those skilled in the art that changes and modifications of the present invention, in its various aspects, may be made without departing from the invention in its broader aspect, some of which changes and modifications being matters of routine engineering or design, and others being apparent only after study. As such, the scope of the invention should not be limited by the particular embodiments and specific constructions described herein but should be defined by the appended claims and equivalents thereof.

We claim:

1. An improved automatic frequency correction acquisition system comprising: an automatic frequency correction loop having an input and operative in an acquisition mode in which an estimate of a frequency offset of a received carrier signal at said input is relatively rapidly acquired when sample timing and signal sequence information is not known and in a tracking mode in which said automatic frequency correction loop more accurately follows changes in said frequency offset, and switchable in response to predetermined control signals between said acquisition mode and said tracking mode; a carrier to impairment ratio estimator coupled with said automatic frequency correction loop, the carrier to impairment ratio estimator estimating a carrier to impairment ratio of the received carrier signal and producing a corresponding carrier to impairment ratio estimate, and an automatic frequency correction controller coupled with said automatic frequency correction loop and with said carrier to impairment ratio estimator and responsive to said carrier to impairment ratio estimate being at or above a preselected threshold value for producing a tracking control signal comprising one of said predetermined control signals, said automatic frequency correction loop being responsive to said tracking control signal for switching from said acquisition mode to said tracking mode.

2. An improved automatic frequency correction acquisition system according to claim 1 wherein said automatic frequency correction controller responds to an acquisition initiation signal by producing an acquisition control signal comprising one of said predetermined control signals, and wherein said automatic frequency correction loop responds to said acquisition control signal by switching to said acquisition mode.

3. An improved automatic frequency correction acquisition system according to claim 2 wherein upon switching of said automatic frequency correction loop to said tracking mode, said automatic frequency correction controller holds said automatic frequency correction loop in said tracking mode until said acquisition initiation signal is received.

4. An improved automatic frequency correction acquisition system according to claim 1 wherein said received carrier signal comprises a phase modulated radio frequency signal and further including a radio frequency front end for converting said radio frequency signal to an intermediate frequency signal, and a phase converter coupled to said automatic frequency correction loop, the phase converter converting said intermediate frequency signal to phase samples to produce an automatic frequency correction input signal with phase modulation and the phase converter delivering said automatic frequency correction input signal to said automatic frequency correction loop.

5. An improved automatic frequency correction acquisition method comprising the steps of: providing an automatic frequency correction loop having an acquisition mode in which an estimate of a frequency offset of a received carrier signal is relatively rapidly acquired when sample timing and signal sequence information is not known and a tracking mode in which said automatic frequency correction loop more accurately follows changes in said frequency offset, and switchable between said acquisition mode and said tracking mode in response to predetermined control signals; initially setting said automatic frequency correction loop to said acquisition mode; estimating a carrier to impairment ratio of the received carrier signal and producing a corresponding carrier to impairment ratio estimate; producing a tracking control signal comprising one of said predetermined control signals in response to the carrier to impairment ratio estimate being at or above a predetermined threshold value, and switching said automatic frequency correction loop from said acquisition mode to said tracking mode in response to said tracking control signal.

6. An improved automatic frequency correction acquisition method according to claim 5 and further including the step of producing an acquisition initiation signal in response to a new carrier signal and switching said automatic frequency correction loop to said acquisition mode in response to said acquisition initiation signal.

7. An improved automatic frequency correction acquisition method according to claim 6 and further including, following the step of switching said automatic frequency correction loop to said tracking mode, the step of holding said automatic frequency correction loop in said tracking mode until said acquisition initiation signal is received.

8. An improved automatic frequency correction acquisition method according to claim 5 wherein the received carrier signal comprises a phase modulated radio frequency signal and further including the steps of converting an incoming radio frequency signal to an intermediate frequency signal, converting said intermediate frequency signal to phase samples to produce an automatic frequency correction input signal with phase modulation and delivering said automatic frequency correction input signal to said automatic frequency correction loop.

9. An improved cable access unit for a cable communications system, comprising: a radio frequency front end for receiving a modulated radio frequency carrier signal with phase modulation and converting the same to a modulated intermediate frequency signal; a phase converter for converting said modulated intermediate frequency signal to produce an automatic frequency correction input signal with phase modulation; an automatic frequency correction loop having an input and operative in an acquisition mode in which an estimate of a frequency offset of a received carrier signal at said input is relatively rapidly acquired when sample timing and signal sequence information is not known and in a tracking mode in which said automatic frequency correction loop more accurately follows changes in said frequency offset, and switchable in response to predetermined control signals between said acquisition mode and said tracking mode; a carrier to impairment ratio estimator coupled with said automatic frequency correction loop for estimating a carrier to impairment ratio of the received carrier signal and producing a corresponding carrier to impairment ratio estimate, and an automatic frequency correction controller coupled with said automatic frequency correction loop and with said carrier to impairment ratio estimator and responsive to said carrier to impairment ratio estimate being at or above a preselected threshold value for producing a tracking control signal comprising one of said predetermined control signals, said automatic frequency correction loop being responsive to said tracking control signal for switching from said acquisition mode to said tracking mode.

* * * * *